(12) United States Patent
Okayasu

(10) Patent No.: US 6,297,672 B1
(45) Date of Patent: Oct. 2, 2001

(54) CMOS INTEGRATED CIRCUIT

(75) Inventor: Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/171,430

(22) PCT Filed: Feb. 26, 1998

(86) PCT No.: PCT/JP98/00775

§ 371 Date: Oct. 19, 1998

§ 102(e) Date: Oct. 19, 1998

(87) PCT Pub. No.: WO98/38739

PCT Pub. Date: Sep. 3, 1998

(30) Foreign Application Priority Data

Feb. 26, 1997 (JP) .................................................. 9-042462

(51) Int. Cl.[7] ........................... H02M 11/00; H03D 11/00
(52) U.S. Cl. ........................ 327/103; 327/112; 327/538
(58) Field of Search ........................... 327/103, 108, 327/109, 112, 538, 543, 540, 541; 323/312, 313, 315

(56) References Cited

U.S. PATENT DOCUMENTS

| | | | | |
|---|---|---|---|---|
| 4,045,747 | * | 8/1977 | Hsu ........................... | 330/277 |
| 4,221,964 | * | 9/1980 | Schlereth et al. .................... | 250/290 |
| 4,335,360 | * | 6/1982 | Hoover ........................... | 330/264 |
| 4,536,662 | * | 8/1985 | Fujii ........................... | 327/108 |
| 5,504,782 | * | 4/1996 | Campbell, Jr. ........................ | 375/259 |
| 5,654,981 | * | 8/1997 | Mahant-Shetti et al. ............ | 375/219 |
| 5,734,293 | * | 3/1998 | Gross ........................... | 327/561 |
| 5,760,601 | * | 6/1998 | Frankeny ........................ | 326/21 |
| 5,767,708 | * | 6/1998 | Groeneveld et al. ................ | 327/132 |
| 5,898,326 | * | 4/1999 | Okayasu ........................ | 327/112 |

FOREIGN PATENT DOCUMENTS 4-207226  7/1992  (JP) .

* cited by examiner

*Primary Examiner*—Terry D. Cunningham
*Assistant Examiner*—Quan Tra
(74) *Attorney, Agent, or Firm*—Gallagher & Lathrop; David N. Lathrop (57) ABSTRACT

In a ultra-large scale integrated circuit of CMOS structure, high speed operation can be performed without being affected by the wiring capacitance and the gate input capacitance. A current-output type gate is used as a transmitting gate 11, and a capacitor 54 is charged or discharged only during the transition time of a signal. The charge or discharge current is multiplied by current Miller circuits 55, 56 to supply the current to a conductive path 15. A current-input type gate is used as a receiving gate 31. This gate 31 is arranged such that the output and input ends of an inverter 35 of CMOS structure are interconnected, respective ends of the inverter to be connected to power supplies are connected to a positive power supply terminal 16 through the current Miller circuit of p-channel MOS.FETs 37, 39 and connected to a negative power supply terminal 17 through the current Miller circuit of n-channel MOS.FETs 38, 41 respectively, and the output ends of both the current Miller circuits are connected to the signal transmission path 15.

6 Claims, 4 Drawing Sheets

FIG. 8A    FIG. 8B

CMOS INTEGRATED CIRCUIT

TECHNICAL FIELD

The present invention relates to an integrated circuit (IC) having a multiplicity of CMOSs (Complementary Metal-Oxide Semiconductors) formed therein, and more particularly, to an improvement in a signal transmission path or line in a ULSI (Ultra-Large Scale Integrated circuit) Of CMOs.

BACKGROUND ART

As is well known, semiconductor elements, logical circuits and the like formed as an LSI (Large Scale Integrated Circuit) are electrically connected in a predetermined manner by wiring. Likewise, in a ULSI having a multiplicity of CMOSs formed therein, CMOSs, logical circuits of CMOSs, and the like are electrically connected in a predetermined manner by wiring. Such wiring may be often formed by conductive paths or conductors of a predetermined pattern formed, for example, on the surface of an integrated circuit.

Figure 6:
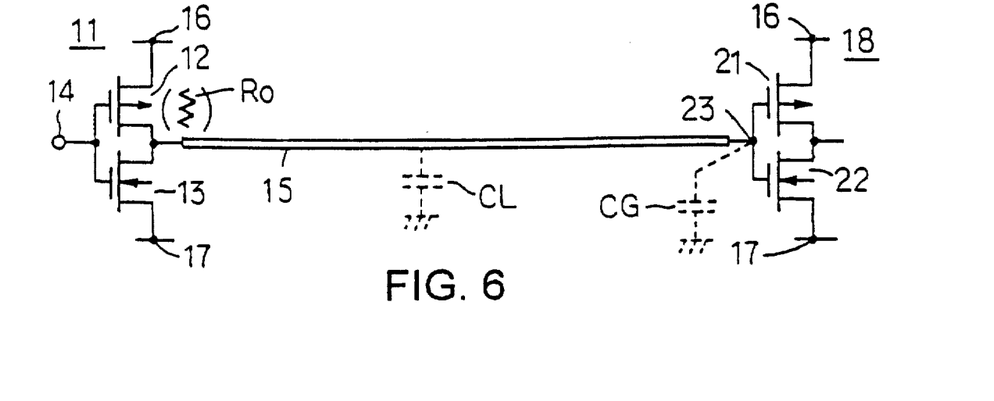
FIG. 6 a schematic diagram showing an example of the internal circuits of a conventional large scale integrated circuit of CMOS structure.

FIG. 6 shows an internal circuit of a conventional ULSI of CMOSs. In this example, there is shown a case in which a gate 11 of one CMOS at a transmitting side (hereinafter, referred to as transmitting gate) and a gate 18 of one CMOS at a receiving side (hereinafter, referred to as receiving gate) are electrically connected through a signal transmission path which is conductive path or conductor 15 in this example. Both of the transmitting gate 11 and the receiving gate 18 are constituted, in this example, by CMOS inverters (each inverter is constituted by a CMOS), respectively.

The transmitting gate 11 comprises a p-channel MOS.FET (MOS Field Effect Transistor) 12 and a n-channel MOS.FET 13 in which both gates thereof are connected with each other and connected to an input terminal 14, both drains thereof are connected with each other and connected to one end (input end) of the conductive path 15, source of the p-channel MOS.FET 12 is connected to a power supply terminal 16 of +VDD (a positive voltage), and source of the n-channel MOS.FET 13 is connected to a power supply terminal 17 of −VSS (a negative voltage). Source of the n-channel MOS.FET 13 may be connected to a common electric potential point or ground potential point.

On the other hand, the receiving gate 18 comprises a p-channel MOS.FET 21 and a n-channel MOS.FET 22 in which both gates thereof are connected with each other and connected to an input terminal 23, both drains thereof are connected with each other and connected to an output terminal (not shown), source of the p-channel MOS.FET 21 is connected to the power supply terminal 16 of +VDD, and source of the n-channel MOS.FET 22 is connected to the power supply terminal 17 of −VSS. The other end (output end) of the conductive path 15 is connected to the input terminal 23.

In such circuit configuration, since there inevitably exist a distributed capacitance CL (shown by broken line) of the conductive path 15 and an input capacitance CG (also shown by broken line) of the receiving gate 18, when a signal is transmitted from the transmitting gate 11 to the receiving gate 18 through the conductive path 15, the distributed capacitance CL of the conductive path 15 and the input capacitance CG of the receiving gate 18 will be charged by this signal. Assuming that an equivalent output resistance of the transmitting gate 11 is $R_0$, the transition time in waveform of a voltage inputted to the receiving gate 18 is equal to $R_0 \times (CL+CG)$.

Figure 7:
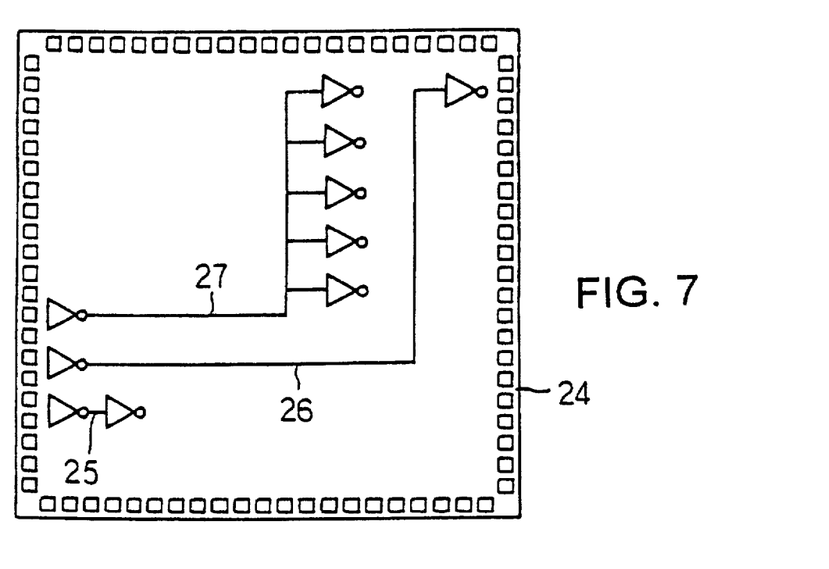
FIG. 7 is a diagrammatical illustration showing signal transmission paths of various lengths in a conventional large scale integrated circuit of CMOS structure.

In reality, the transition time is also affected by a distributed resistance of the conductive path 15, but usually the equivalent output resistance $R_0$ is dominative over this distributed resistance and hence the influence of the distributed resistance is omitted herein. In addition, the equivalent output resistance $R_0$ has a nature of non-linearity so that the resistance value can be varied with change of the voltage. However, for clarity of the explanation, such characteristic is ignored herein. Recently, ICs are growing in density of integration and degree of scale thereof higher and larger, and the size of an IC chip is also increasing more and more. For example, as shown in FIG. 7, there is not rare a ULSI in which the length of one side of its chip 24 is longer than 15 mm. In such large IC chip, wiring or conductive paths connecting circuits, elements, and the like formed in the IC chip with one another become long in their lengths, and there appears a conductive path which is longer than 20 mm. In an estimation of some ULSI, the number of conductive paths larger than 20 mm has become more than 5% of the total number of conductive paths.

FIG. 7 shows an example of the internal circuits of a conventional ULSI of CMOSs. It diagrammatically illustrates a multiplicity of gates, and wiring connecting therebetween, namely, conductive paths 25, 26 and 27. As shown, in addition to the conductive path 25 having a comparatively short length (200 μm or so), there are the conductive path 26 being a very long (larger than 20 mm) and the conductive path 27 which is a very long (larger than 20 mm) and has a plurality of gates as its loads. Such conductive path 27 is used in distributing a clock signal or transmitting a bus signal, and these signals affect the whole performance (operation speed or rate) of the IC chip, namely, ULSI.

Figure 8A:
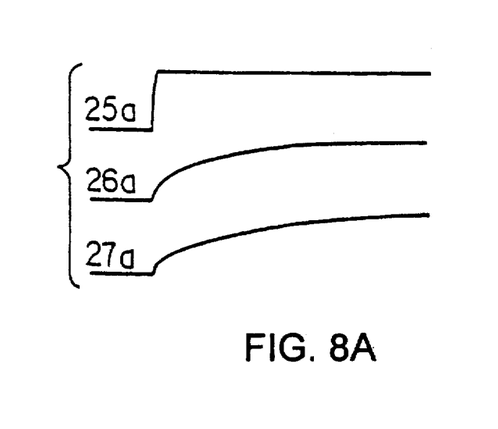
FIGS. 8A and 8B are waveforms showing responses of a receiving gate when a step waveform and an impulse are transmitted through the transmission paths of various lengths shown in FIG. 7, respectively.
Figure 8B:
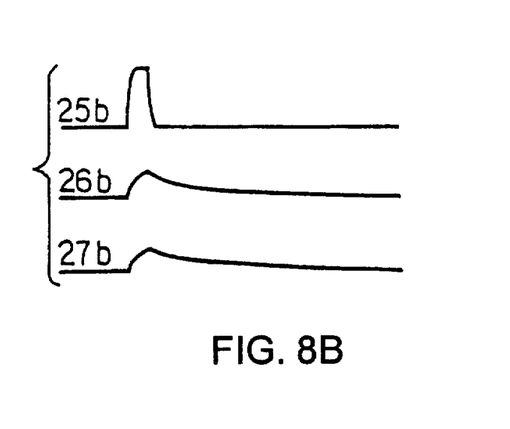

In FIG. 7, in case that a step waveform is transmitted from transmitting gates (three gates at left side in the drawing) to corresponding receiving gates through the respective conductive paths 25, 26 and 27, the input waveforms at the receiving gates are as shown in FIG. 8A by curves 25a, 26a and 27a, respectively, and in case that an impulse is transmitted from the transmitting gates to the corresponding receiving gates through the respective conductive paths 25, 26 and 27, the input waveforms at the receiving gates are as shown in FIG. 8B by curves 25b, 26b and 27b, respectively. As is apparent from these waveforms, owing to that the longer conductive paths 26 and 27 have very long transition times respectively as compared with the short conductive path 25, the propagation delay-times of the conductive paths 26 and 27 are remarkably long in respect to the step response thereof and in respect to the pulse response thereof, if the pulse width is short, the pulse is disappeared. As a result, a clock signal having a high frequency (a short repetitive period) cannot pass through a conductive path of long distance. In other words, there is an important drawback that the performance (operation speed or rate) of the whole IC chip cannot be made high.

In addition, in order to increase the density of integration of an IC and to reduce the power consumption of an IC more and more, miniaturization of a CMOS is growing and the operation speed of an unity gate is improved. However, the equivalent output resistance $R_0$ becomes high and the distributed capacitance of wiring per unit length tends to rather increase than is unchanged. Consequently, the transition time is further long, resulting in a shortcoming that the operation speed of the IC chip is limited more and more.

In view of such disadvantages, recently, in order to improve the throughput of wiring in an IC chip, a method of transmitting a signal in an IC chip using light has been researched or studied. However, it is necessary that light emitting elements and light receiving elements of compound semiconductors are formed on the surface of a silicon (Si) chip and that an optical waveguide is constituted separately of an electrical wiring layer. Therefore, it is difficult at present to implement such optical signal transmission method, and even if such method should be implemented, vast increases in size and cost are estimated.

DISCLOSURE OF THE INVENTION

An object of the present invention is to provide a large scale integrated circuit of CMOS structure in which a signal can be transmitted therein at high speed or rate.

In the present invention, in order to attain the above object, there is provided an integrated circuit of CMOS structure which is characterized in that a current-input type gate having a remarkably low input impedance is used as a gate at the receiving side in respect to a signal transmission path in the integrated circuit, the current-input type gate generating an output voltage depending upon the magnitude of an input current.

In a preferred embodiment, the current-input type gate has its input terminal which is connected to a positive power supply terminal through a first current mirror circuit constituted by p-channel MOS.FETs and connected to a negative power supply terminal through a second current mirror circuit constituted by n-channel MOS.FETs.

In a first modification, the current-input type gate further includes an inverter of CMOS structure the input end and the output end of which are interconnected, and wherein the input end of the inverter is connected to the input terminal and respective ends of the inverter to be connected to power supply terminals are connected to the input side of the first current mirror circuit and the input side of the second current mirror circuit, respectively.

In a second modification, the current-input type gate is arranged such that the output end of the inverter of CMOS structure is connected to the input terminal, to the input end of the inverter is supplied with the mid point potential between the positive power supply voltage and the negative power supply voltage, and respective ends of the inverter to be connected to power supply terminals are connected to the input side of the first current mirror circuit and the input side of the second current mirror circuit, respectively.

In a third modification, the current-input type gate includes an n-channel MOS.FET inserted in series between the input terminal and the input side of the first current mirror circuit, and a p-channel MOS.FET inserted in series between the input terminal and the input side of the second current mirror circuit, and a potential of addition of the mid point potential between the positive and negative power supply voltages to a threshold voltage of the n-channel MOS.FET is applied to gate of the n-channel MOS.FET, a potential of subtraction of a threshold voltage of the p-channel MOS.FET from the mid point potential between the positive and negative power supply voltages being applied to gate of the p-channel MOS.FET.

In another preferred embodiment, the current-input type gate comprises a differential amplifier an inverting input end of which is connected to the input terminal, and a negative feedback capacitor connected between the inverting input end and an output end of the differential amplifier, the mid point potential of an input logical signal being applied to a non-inverting input end of the differential amplifier.

In each of the embodiments and each of the modifications, a gate at the transmitting side in respect to the signal transmission path is a current-output type gate, and it is preferred that this current-output type gate is an inverter of CMOS structure.

In a further embodiment, the current-output type gate is a gate arranged such that an output end of an inverter of CMOS structure is grounded through a capacitor, respective ends of the inverter to be connected to power supplies are connected to a positive power supply terminal through a first current mirror circuit constituted by p-channel MOS.FETs and connected to a negative power supply terminal through a second current mirror circuit constituted by n-channel MOS.FETs respectively, and the output ends of the first and second current mirror circuits are connected to the signal transmission path. Further, a resistance element for maintaining a current may be connected in parallel with the capacitor.

According to the construction of the present invention as mentioned above, since a current-input type gate having a low impedance is used as a receiving gate, the wiring capacitance CL and the gate input capacitance CG can be rapidly charged, and hence the transition time of a signal is rendered remarkably short. As a result, it is possible that even a clock signal having a high frequency (short repetitive period) passes through a long conductive path in the CMOS.IC, and so the performance (operation speed or rate) of the whole CMOS.IC chip can be made high.

BEST MODES FOR CARRYING OUT THE INVENTION

Now, some embodiments of the present invention will be described in detail with reference to FIGS. 1 to 5.

Figure 1:
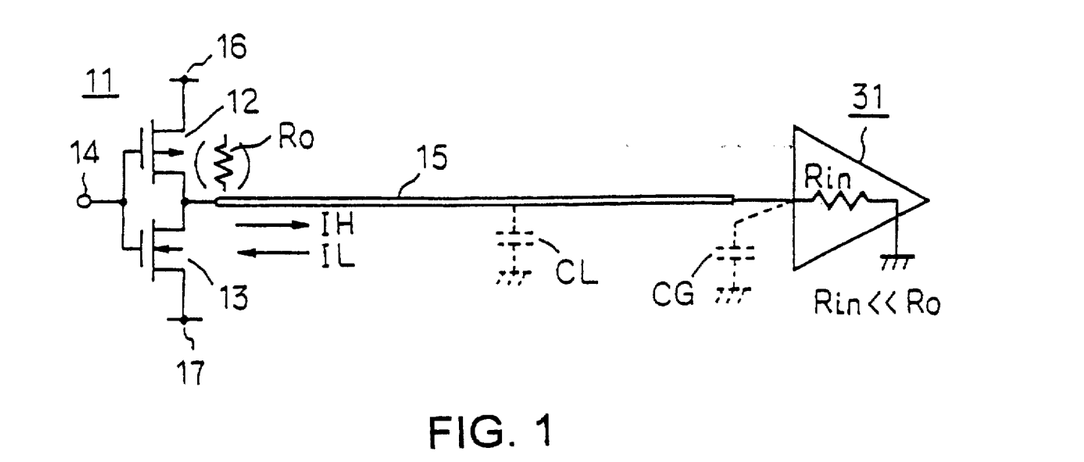
FIG. 1 is a schematic diagram showing an internal circuit of a first embodiment of the large scale integrated circuit of CMOS structure according to the present invention.

FIG. 1 shows an internal circuit of the first embodiment of the large scale integrated circuit of CMOS structure according to the present invention. In the following, portions and elements in FIGS. 1 to 5 corresponding to those in FIG. 6 are denoted by the same reference characters as those in FIG. 6, and the explanations thereof are omitted unless necessary.

In the first embodiment, a transmitting gate 11 is also constituted as an inverter comprising a p-channel MOS.FET 12 and an n-channel MOS.FET 13, and has the same configuration as that of the conventional transmitting gate 11 shown in FIG. 6. Accordingly, the explanation thereof is omitted.

A receiving gate 31 connected to the output end of a conductive path or conductor (signal transmission path) 15 is constituted as a gate 31 which is of a current-input type and having a low input impedance (hereinafter, referred to as charge responsive type gate). The input impedance Rin of this charge responsive type gate 31 is sufficiently low as compared to the equivalent output resistance $R_0$ of the transmitting gate 11. As a result, the charge responsive type gate 31 acts to make the amplitude of an input voltage substantially zero and hence to make a current flowing in the load capacitance substantially zero thereby generating an output voltage depending on an input current.

Figure 2A:
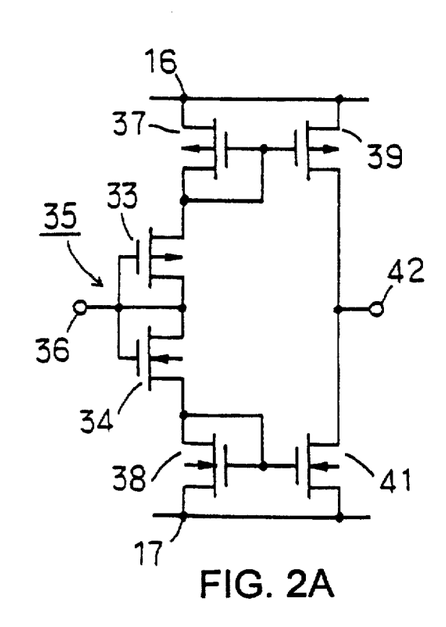
FIGS. 2A and 2B are schematic diagrams showing two electric circuits of the charge responsive type gate shown in FIG. 1, respectively.

An example of the circuit diagrams of the charge responsive type gate 31 is shown in FIG. 2A. This charge responsive type gate 31 comprises an inverter 35 constituted by a p-channel MOS.FET 33 and an n-channel MOS.FET 34, a p-channel MOS.FET 37 connected between source of the p-channel MOS.FET 33 and a power supply terminal 16 of +VDD, an n-channel MOS.FET 38 connected between source of the n-channel MOS.FET 34 and a power supply terminal 17 of −VSS or ground potential terminal, and a p-channel MOS.FET 39 and an n-channel MOS.FET 41 connected in their gates to gates of the MOS.FETs 37 and 38 respectively.

The input end (gates connected in common) and the output end (drains connected in common) of the inverter 35 are interconnected and are connected to an input terminal 36. Source of the p-channel MOS.FET 33 is connected to the power supply terminal 16 of +VDD through drain-source of the p-channel MOS.FET 37, and source of the n-channel MOS.FET 34 is connected to the power supply terminal 17 of −VSS or ground potential terminal through drain-source of the n-channel MOS.FET 38. Drain and gate of the MOS.FET 37 are interconnected, and also drain and gate of the MOS.FET 38 are interconnected. Drains of the MOS.FET 39 and 41 are interconnected and are connected to an output terminal 42, and sources thereof are connected to the power supply terminals 16 and 17, respectively. In other words, both ends of the inverter 35 to be connected to power sources are connected to input sides of a current mirror circuit constituted by the p-channel MOS.FETs 37, 39 and a current mirror circuit constituted by the n-channel MOS.FETs 38, 41 respectively.

In accordance with the arrangement discussed above, since the input end and the output end of the inverter 35 are short-circuited, the impedance Rin as has seen from the input terminal 36 is very low, and the potential of the input terminal 36 comes to substantially one at the mid point of +VDD and −VSS (or 0 V). That is, the potential of the input terminal 36 becomes the threshold voltage of the inverter 35, namely, the input voltage by which the output logic of the inverter 35 is inverted, and both the MOS.FETs 33 and 34 are self-biased in between drain and source of each of them by this threshold voltage, respectively.

As described above, since the potential of the input terminal 36 is one by which the inverter 35 is inverted, the impedance between drain and source of each of the MOS.FETs 33 and 34 is remarkably low, and the impedance of the input terminal 36 is a value of parallel connected impedances between drains and sources of the MOS.FETs 33 and 34 and hence is the lowest value. In addition, due to the effect of the negative feedback, the impedance of the input terminal 36 is further lowered, and yet, if it will depart from the lowest impedance point, an action exerts thereon for returning back to the lowest impedance point.

Moreover, the MOS.FETs 37 and 39 form a current mirror circuit and also the MOS.FETs 38 and 41 form a current mirror circuit. The input impedance of the current mirror circuit of the MOS.FETs 37 and 39, namely, the impedance of drain of the MOS.FET 37 is set to be equal to the input impedance of the current mirror circuit of the MOS.FETs 38 and 41, namely, the impedance of drain of the MOS.FET 38. In addition, it is designed that ratio of beta (p) of the FET 33 to that of the FET 34 is 1:1 and the threshold voltages of both the FETs 33 and 34 are equal to each other. Consequently, the voltage of the input terminal 36 just becomes the mid point of the power supply voltages +VDD and −VSS.

Further, the illustrated gate circuit has a steady-state current flow passing through the FETs 33, 34, 37 and 38 even if the input of the gate circuit is open. Therefore, in view of reducing the power consumption, it is desired that sizes of the FETs 33, 34, 37 and 38, that is, gate widths thereof are decreased. In practice, the gate widths of the FETs 33, 34, 37 and 38 are determined based on a trade-off between the power consumption and the operation speed or rate.

A current flowing from the transmitting gate 11 to the input terminal 36 all of it passes through the FET 37 or 38 of the current mirror circuit and hence the impedance as seen from the FET 33 or 34 toward the FET 37 or 38 is very low because of the current input. In this case, when a current flows from the transmitting gate 11 toward the input terminal 36 (see IH in FIG. 1), it flows through the FET 38, and when a current flows from the input terminal 36 toward the transmitting gate 11 (see IL in FIG. 1), it flows through the FET 37. At that time, a current flows through the FET 39 or 41 and a difference between the current flows through the FET 39 and the FET 41 is proportional to the difference between the current flows through the FET 37 and the FET 38. In case the current flow through the FET 39 is larger than that through the FET 41, the potential of the output terminal 42 rises to about +VDD. On the contrary, in case the current flow through the FET 41 is larger than that through the FET 39, the potential of the output terminal 42 falls to about −VSS.

Since the charge responsive type gate 31 shown in FIG. 1 has a remarkably low input impedance Rin as described above, the distributed capacitance CL of the conductive path 15 (wiring capacitance) and the input capacitance CG of the gate 31 are both in substantially short-circuited state by such very low input impedance of the gate 31. As a result, it is hardly necessary that a signal outputted from the transmitting gate 11 charges the wiring capacitance CL and the gate input capacitance CG, and the transition time is very short. In other words, a change of the signal outputted from the transmitting gate 11 is transmitted to the input terminal 36 of the receiving gate 31 at high speed. In addition, if the output of the transmitting gate 11 comes to a high level, in the example shown in FIG. 2A, the potential of the output terminal 42 of the receiving gate 31 reaches about −VSS, and if the output of the transmitting gate 11 comes to a low level, the potential of the output terminal 42 of the receiving gate 31 reaches about +VDD. Accordingly, the output of the transmitting gate 11 is inverted and the inverted output appears at the output terminal 42 of the receiving gate 31.

Figure 2B:
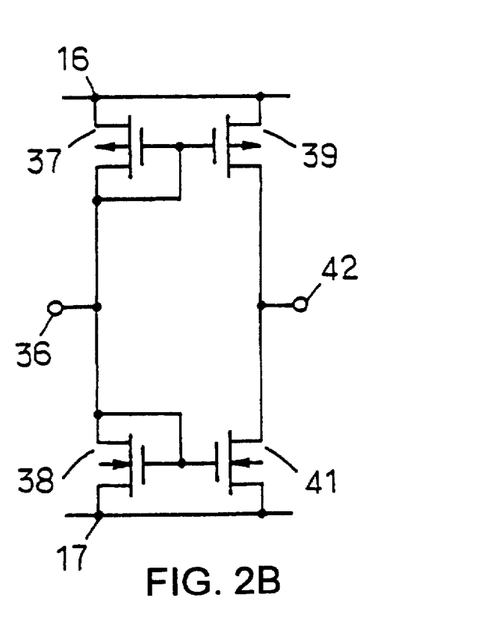

As the charge responsive type gate 31, a gate as shown in FIG. 2B may be used wherein the inverter 35 shown in FIG. 2A is omitted and the input terminal 36 is directly connected to drain of the FET 37 and drain of the FET 38. In this first modification of the charge responsive type gate 31, the potential of the input terminal 36 becomes a potential at the mid point between +VDD and −VSS and it is a current input to both the current mirror circuits, and therefore the input impedance is low. As a result, similar functional effects to the charge responsive type gate circuit shown in FIG. 2A can be obtained. In this case, the input impedance of the charge responsive type gate circuit shown in FIG. 2B is higher than that of the charge responsive type gate circuit shown in FIG. 2A and also a current flowing through the FETs in steady-state in FIG. 2B is larger than that in FIG. 2A. However, an advantage is obtained from the charge responsive type gate circuit of FIG. 2B that the number of elements, namely, FETs is smaller than that of the charge responsive type gate circuit of FIG. 2A.

Figure 3A:
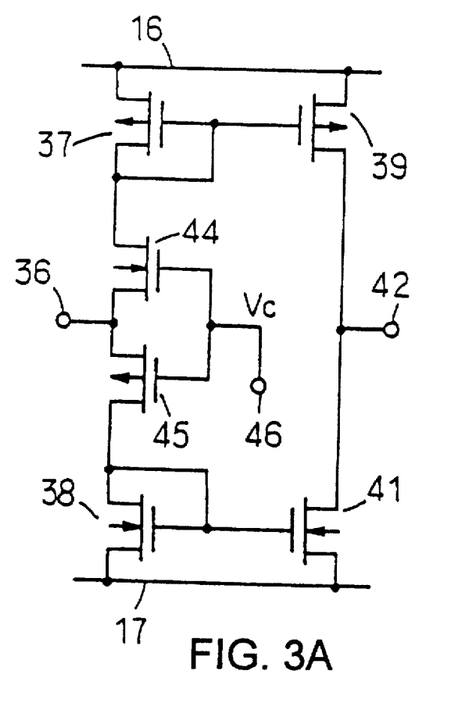
FIGS. 3A, 3B and 3C are schematic diagrams showing three electric circuits of the charge responsive type gate in which a steady-state current can be zero.

FIG. 3A shows a second modification of the charge responsive type gate 31. This second modification includes an n-channel MOS.FET 44 and a p-channel MOS.FET 45 in place of the inverter 35 in FIG. 2A, and is arranged such that sources of the MOS.FETs 44 and 35 are connected to the input terminal 36, gates thereof are connected to a terminal 46, drains thereof are connected to corresponding drains of the MOS.FETs 37 and 38 respectively, and a potential Vc at the mid point between the power supply terminal 16 of +VDD and the power supply terminal 17 of −VSS is applied to the terminal 46.

In the above circuit configuration, if the potential of the input terminal 36 is within limits of Vc±Vth (Vth is a threshold voltage of each of the FETs 44 and 45), no source current flows through the FETs 44 and 45, and hence the input impedance becomes high. In case the input of the gate is open, any steady-state current does not flow through the FETs 44 and 45. If the input voltage of the input terminal 36 is even slightly out of the limits of Vc±Vth, the FET 44 or 45 becomes conductive, and in response thereto, the output voltage of the output terminal 42 approaches +VDD or −VSS. Since there are many cases that Vth is set to 10% or so of the power supply voltage, the amplitude of the voltage at the input terminal 36 will come to 20% or so of the power supply voltage. If the amplitude of the voltage is of such value, an operation of sufficiently high speed or rate is usually expected. More particularly, it is possible to make the amplitude of an input voltage a small value of about 2Vth, and so a signal can be transmitted without being greatly affected by the wiring capacitance CL and the gate input capacitance CG. In other words, the transition time can be remarkably shorted as compared to the prior art. Further, in practice, Vth differs between a p-channel MOS.FET and an n-channel MOS.FET. For the purpose of easy understanding, it is assumed here that Vth of a p-channel MOS.FET is equal to that of an n-channel MOS.FET.

Figure 3B:
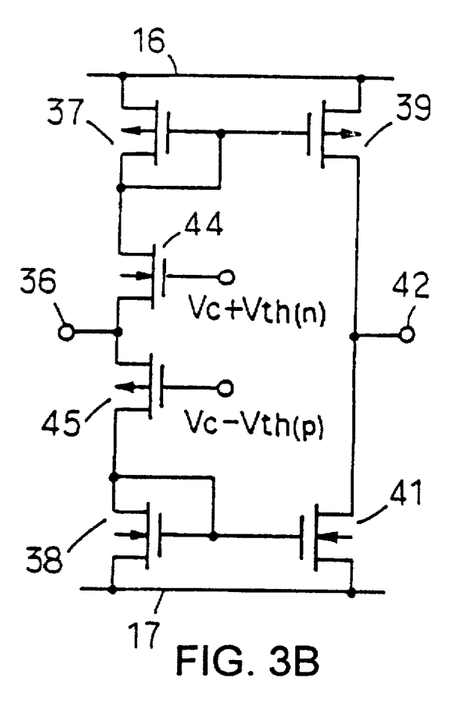

If it is desired to make a steady-state current flow zero and to make the amplitude of the voltage at the input terminal 36 smaller, as shown in FIG. 3B, gates of the FETs 44 and 45 are disconnected from each other and gate of the FET 44 is supplied with Vc+Vth(n) (Vth(n) is a threshold voltage of the n-channel FET 44) and gate of the FET 45 is supplied with Vc−Vth(p) (Vth(p) is a threshold voltage of the p-channel FET 45). In this state, since the FET 44 has its gate supplied with Vc+Vth(n) and the FET 45, has its gate supplied with vc−vth(p), if the potential of the input terminal 36 should be lowered even slightly below Vc, a current flows through the FET 44. On the contrary, if the potential of the input terminal 36 should be increased even slightly over Vc, a current flows through the FET 45.

Figure 3C:
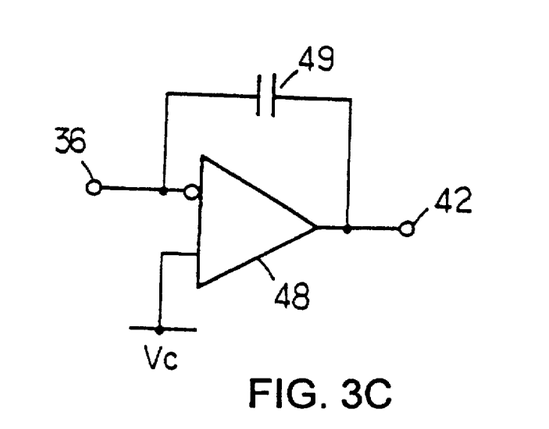

As the charge responsive type gate 31, a gate as shown in FIG. 3C may be used wherein an inverting input terminal of a differential amplifier 48 is connected to the input terminal 36, its output terminal is connected to the output terminal 42, a negative feedback capacitor 49 is connected between the output terminal and the inverting input terminal of the amplifier 48, and the mid point voltage Vc is applied to a non-inverting input terminal of the amplifier 48, the differential amplifier 48 having high gain and wide or broad band and operating at high speed or rate.

This differential amplifier 48 integrates a current flowing into the input terminal 36, and outputs an output voltage which is proportional to the integrated value and is inverted in polarity. As a result, if the potential at the input terminal 36 should rise even slightly over Vc, a rapid charge of the capacitor 49 is effected by a negative feedback current so as to cancel the difference between the potential of the input terminal 36 and Vc so that the output voltage at the output terminal 42 is lowered. On the other hand, if the potential at the input terminal 36 should fall even slightly below Vc, a rapid charge of the capacitor 49 is effected by a negative feedback current having the inverted polarity so as to cancel the difference between the potential of the input terminal 36 and Vc so that the output voltage at the output terminal 42 is increased. Accordingly, the potential at the input terminal 36 is maintained at vc and the input impedance becomes substantially zero.

As described above, since the differential amplifier 48 has high gain and operates in wide-band, and moreover the input impedance comes to substantially zero, it can rapidly integrate an input current supplied to the input terminal 36. Therefore, the wiring capacitance CL and the gate input capacitance CG are quickly charged and the transition time is rendered very short so that high speed operation can be performed. Further, in order to meet the range of input voltage of the succeeding stage, a circuit for limiting the amplitude of the output voltage may be connected to the output terminal 42, if necessary.

The charge responsive type gates 31 shown in FIGS. 2A and 2B always consume the power. In case the transmitting gate 11 is of the type in which it outputs only a transient current, the current contributing to a signal transmission is only a transient current flowing in transition of a signal, and hence it is much preferred to arrange such that only the transient current flows.

Figure 4:
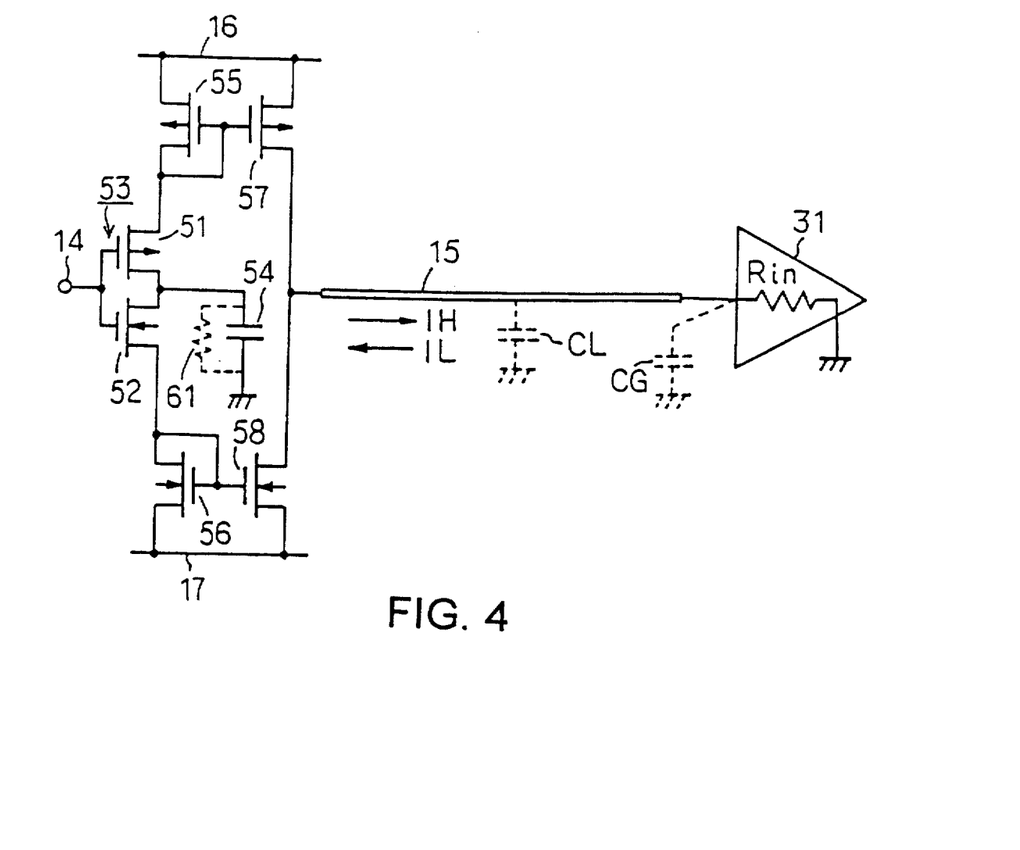
FIG. 4 is a schematic diagram showing an internal circuit of a second embodiment of the large scale integrated circuit of CMOS structure according to the present invention.

FIG. 4 shows an internal circuit of the second embodiment of the large scale integrated circuit of CMOS structure according to the present invention, and illustrates a case arranged to flow only a transient current.

In the second embodiment, as the transmitting gate 11, a gate is used which has its circuit configuration similar to that of the charge responsive type gate 31 that is the receiving gate shown in FIG. 2A. This transmitting gate 11 comprises an inverter 53 constituted by a p-channel MOS.FET 51 and an n-channel MOS.FET 52, a p-channel MOS FET 55 connected between source of the p-channel MOS.FET 51 and a power supply (positive potential) terminal 16 of +VDD, an n-channel MOS.FET 56 connected between source of the n-channel MOS.FET 52 and a power supply (negative potential) terminal 17 of −VSS or ground or common potential terminal, and a p-channel MOS.FET 57 and an n-channel MOS.FET 58 connected in their gates to gates of the MOS.FETs 55 and 56 respectively.

The input end, namely, gates connected in common of the inverter 53 are connected to the input terminal 14 and the output end, namely drains connected in common of the inverter 53 are connected to the common potential point or ground potential point through a capacitor 54. Source of the p-channel MOS.FET 51 is connected to the power supply terminal 16 of +VDD through drain-source of the p-channel MOS.FET 55, and source of the n-channel MOS.FET 52 is connected to the power supply terminal 17 of −VSS through drain-source of the n-channel MOS.FET 56. Drain and gate of the MOS.FET 55 are interconnected, and also drain and gate of the MOS.FET 56 are interconnected. Drains of the MOS.FET 57 and 58 are interconnected and are connected to the input end of the conductive path 15, and sources thereof are connected to the power supply terminals 16 and 17, respectively. In other words, in this second embodiment, both ends of the inverter 53 to be connected to power sources are also connected to input sides of a current mirror circuit constituted by the p-channel MOS.FETs 55, 57 and a current mirror circuit constituted by the n-channel MOS.FETs 56, 58 respectively. Thus, it will be understood that the construction of this transmitting gate is the same as that of the charge responsive type gate 31 shown in FIG. 2A except that the input and output ends of the inverter 35 are not connected in common, and in place thereof, only the input end is connected to input terminal 36 and the output end is connected to the common potential or ground potential point through the capacitor 54.

In the above circuit configuration, when the potential at the input terminal 14 becomes a higher level than Vc of the mid point potential between the power supply voltages +VDD and −VSS, a current flows through the FET 52 so that the capacitor 54 is charged with its electrode connected to the FET 52 being negative. The current signal is multiplied by the current mirror circuit constituted by the FETs 56 and 58 thereby generating a transient current on the conductive path 15, which acts to draw a current (IL) from the receiving gate 31. When the transition time of this current signal ends, the current through the FETs of the transmitting gate comes to zero so that no steady-state power consumption occurs in the transmitting gate.

When the potential at the input terminal 14 is lowered below Vc, a current flows through the FET 51 so that the capacitor 54 is charged with its electrode connected to the FET 51 being positive. The current signal is multiplied by the current mirror circuit constituted by the FETs 55 and 57 thereby supplying a current (IH) to the conductive path 15, which flows toward the receiving gate 31 through the conductive path,15. In this case, when the transition time of this current signal ends, the current through the FETs of the transmitting gate also comes to zero so that no steady-state power consumption occurs in the transmitting gate.

Even in the case the transmitting gate 11 is used which is arranged such that a current flows only during the transition time of a signal as discussed above, if a gate of the type in which a steady-state current flows through the gate, as shown in FIGS. 2A and 2B, is used as the receiving charge responsive type gate 31, electric charges stored in the wiring capacitance CL and the gate input capacitance CG are discharged so that the signal output state of the receiving gate 11 cannot be maintained when the interval between successive transitions of the signal on the input terminal 14 is long (the time duration in which no current flows at all is long).

In such case, as shown in FIG. 4 by dotted lines, a resistance element (or an FET acting as a resistance element) 61 may be connected in parallel with the capacitor 54 to flow a minute current through the resistance element 61 for maintaining the charged potentials of the capacitances, thereby to retain the signal output state corresponding to the signal input state of the input terminal 14 in respect to the conductive path 15. This resistance element 61 may be one through which a minimum current can flow so that the signal output state can be retained in any time duration other than the transition time.

In case a gate of the type in which any steady-state current or any leakage current does not flow through the gate, as shown in FIGS. 3A and 3B, is used as the receiving charge responsive type gate 31, the transmitting gate shown in FIG. 4 can be used. However, if it is difficult to retain the input potential of the charge responsive type gate 31 stationarily for a long time due to the existence of a minute leakage current, as previously mentioned, a resistance element is connected in parallel with the capacitor 54 in case a signal to be transmitted does not change for a long time.

In case the charge responsive type gate shown in FIG. 3C is used as the receiving charge responsive type gate 31, it is unnecessary in this case to connect a resistance element in parallel with the capacitor 54 so that a current can flow through the resistance element for maintaining the charged potentials of the capacitances except a case that a signal to be transmitted does not change for a long time, though it is depending upon the input leakage current of the differential amplifier 48.

Further, in case a gate of the type in which a steady-state current flows through the gate, as shown in FIG. 1, is used as the transmitting charge responsive type gate 11, any one of the charge responsive type gates can be used. In case of transmitting a signal the transition of which always occurs at high rate or speed such as a clock signal, if the transmitting gate shown in FIG. 4 is used, any one of the charge responsive type gates shown in FIGS. 2A and 2B, and FIGS. 3A, 3B and 3C may be provided at the receiving side.

Figure 5:
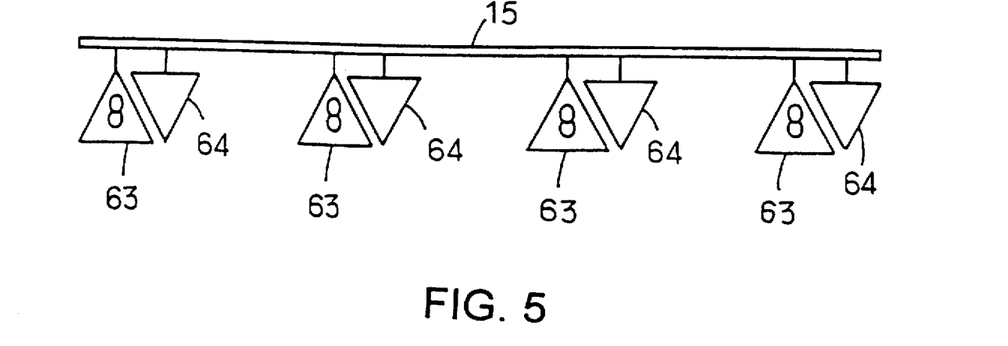
FIG. 5 is a block diagram showing an internal circuit of a third embodiment of the large scale integrated circuit of CMOS structure according to the present invention.

Since the transmitting gate 11 is a current-output type gate and the receiving gate 31 is a charge responsive type gate, namely, a current-input type gate, it can be easily implemented that, as shown in FIG. 5 for example, a plurality of transmitting current-output type gates 63 are connected to the conductive path 15, and in addition, a plurality of receiving current-input type gates 64 are connected to the conductive path 15 thereby using the conductive path 15 as a bus. Particularly, if as the current-output type gate 63 is used the transition current output gate which outputs a current only during the transition time as shown in FIG. 4 and as the current-input type gate 64 is used the charge responsive type gate through which no steady-state current flows as shown in FIGS. 3A and 3B, no current flows through the conductive path 15 in the steady-state, and hence it is not required to set the current-output type gate 63 in high impedance state (inhibit state). Consequently, the control circuit and the control of timing therefor are not needed.

As described above, in accordance with the present invention, since a current-input type gate having a low impedance is used as a receiving gate, the wiring capacitance CL and the gate input capacitance CG can be quickly charged, and hence the transition time of a signal is rendered remarkably short. As a result, it is possible that even a clock signal having a high frequency (short repetitive period) passes through a long conductive path in the CMOS.IC, and so the performance (operation speed or rate) of the whole CMOS.IC chip can be made high. In particular, the power consumption can be reduced to minimum by using, as a transmitting gate, a gate which outputs a current flow only during the transition time of a signal and, as a receiving gate, a gate through which no steady-state current flows.

What is claimed is:

1. An integrated circuit of CMOS structure comprising:
   a signal transmission path having an impedance in the integrated circuit;

a current-input type gate having an input terminal coupled to said signal transmission path and receiving an input current via said input terminal, said current-input type gate having a low input impedance relative to said impedance of said signal transmission path and generating an output voltage depending upon the magnitude of the input current;

a first current mirror circuit constituted by p-channel MOS.FETs, said first current mirror circuit connecting one of terminals which are to be connected to power supply terminals, of said current-input type gate to a positive power supply terminal; and a second current mirror circuit constituted by n-channel MOS.FETs, said second current mirror circuit connecting the other of terminals which are to be connected to power supply terminals, of said current-input type gate to a negative power supply terminal, and wherein said current-input type gate includes an inverter of CMOS structure the output end of which is connected to said input terminal, one of terminals of said inverter to be connected to power supply terminals is connected to said positive power supply terminal via said first current mirror circuit, the other of terminals of said inverter to be connected to power supply terminals is connected to said negative power supply terminal via said second current mirror circuit, and a mid point potential between the positive and negative power supply voltages is applied to the input end of said inverter.

2. The integrated circuit of CMOS structure according to claim 1, wherein an n-channel MOS.FET is inserted in series between said input terminal and the input side of said first current mirror circuit, a potential of addition of the mid point potential between said positive and negative power supply voltages and a threshold voltage of said n-channel MOS.FET is applied to gate of said n-channel MOS.FET, a p-channel MOS.FET is inserted in series between said input terminal and the input side of said second current mirror circuit, and a potential of subtraction of a threshold voltage of said p-channel MOS.FET from said mid point potential between said positive and negative power supply voltages is applied to gate of said p-channel MOS FET.

3. The integrated circuit of CMOS structure according to claim 1 or 2, wherein a gate at the transmitting side in respect to said signal transmission path is a current-output type gate.

4. The integrated circuit of CMOS structure according to claim 3, wherein said current-output type gate is an inverter of CMOS structure.

5. The integrated circuit of CMOS structure according to claim 3, wherein said current-output type gate is a gate arranged such that the output end of an inverter of CMOS structure is grounded through a capacitor, respective ends of said inverter to be connected to power supplies are connected to a positive power supply terminal through a first current mirror circuit constituted by p-channel MOS.FETs and connected to a negative power supply terminal through a second current mirror circuit constituted by n-channel MOS.FETs respectively, and the output ends of said first and second current mirror circuits are connected to said signal transmission path.

6. The integrated circuit of CMOS structure according to claim 5, wherein a resistance element for maintaining a current is connected in parallel with said capacitor.

\* \* \* \* \*